(12) United States Patent
Gross et al.

(10) Patent No.: US 8,255,341 B2
(45) Date of Patent: *Aug. 28, 2012

(54) ANALYZING A TARGET ELECTROMAGNETIC SIGNAL RADIATING FROM A COMPUTER SYSTEM

(75) Inventors: Kenny C. Gross, San Diego, CA (US); Ramakrishna C. Dhanekula, San Diego, CA (US); Andrew J. Lewis, Litchfield, NY (US); Aleksey M. Urmanov, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 921 days.

This patent is subject to a terminal disclaimer.

(21) Appl. No.: 12/340,029

(22) Filed: Dec. 19, 2008

(65) Prior Publication Data

US 2010/0161525 A1 Jun. 24, 2010

(51) Int. Cl.
*G06F 15/18* (2006.01)
(52) U.S. Cl. .................................................. 706/12
(58) Field of Classification Search .................. None
See application file for complete search history.

(56) References Cited

U.S. PATENT DOCUMENTS

| | | | |
|---|---|---|---|
| 6,724,348 B2* | 4/2004 | Fang | 343/702 |
| 7,072,669 B1* | 7/2006 | Duckworth | 455/456.1 |
| 2002/0069030 A1* | 6/2002 | Xydis | 702/176 |

OTHER PUBLICATIONS

Xu et al. "Independent Component Analysis Applied to Multiple Antenna Space-Time Systems", PIMRC 2005, pp. 6.*
Kwok et al. "Mobile Robot Localization and Mapping using a Gaussian Sum Filter", IJCAS, vol. 5, No. 3, 2007, pp. 251-268.*
Weiss et al. "Electromagnetic radiation emitted from video computer terminals", Am. Ind. Hyg. Assoc. J. 40, 1979, pp. 300-309.*
TEMPSET attacks, http://www.surasoft.com/articles/tempest.php , 2005, pp. 5.*

* cited by examiner

*Primary Examiner* — Jeffrey A Gaffin
*Assistant Examiner* — Li-Wu Chang
(74) *Attorney, Agent, or Firm* — Park, Vaughan, Fleming & Dowler LLP

(57) ABSTRACT

One embodiment of the present invention provides a system that characterizes a computer system parameter by analyzing a target electromagnetic signal radiating from the computer system. First, the system monitors the target electromagnetic signal using a first directional antenna located outside of the computer system, wherein the first directional antenna is directed at a location inside the computer system. The system also monitors the target electromagnetic signal using a second directional antenna located outside of the computer system, wherein a receiving axis of the second antenna is oriented non-parallel to a receiving axis of the first antenna, and wherein the second directional antenna is directed at the location inside the computer system. Next, the system characterizes the computer system parameter based on the target electromagnetic signal received from the first antenna and the target electromagnetic signal received from the second antenna. Then, the system generates a request for an action based on the characterization of the computer system.

18 Claims, 9 Drawing Sheets

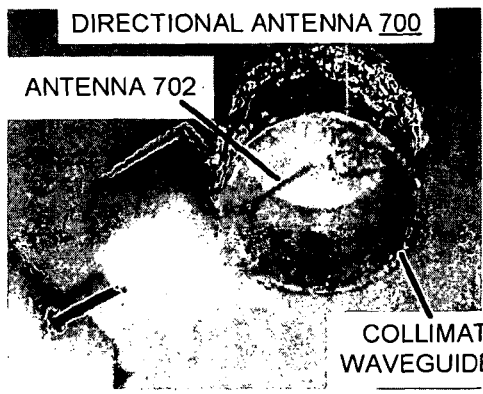
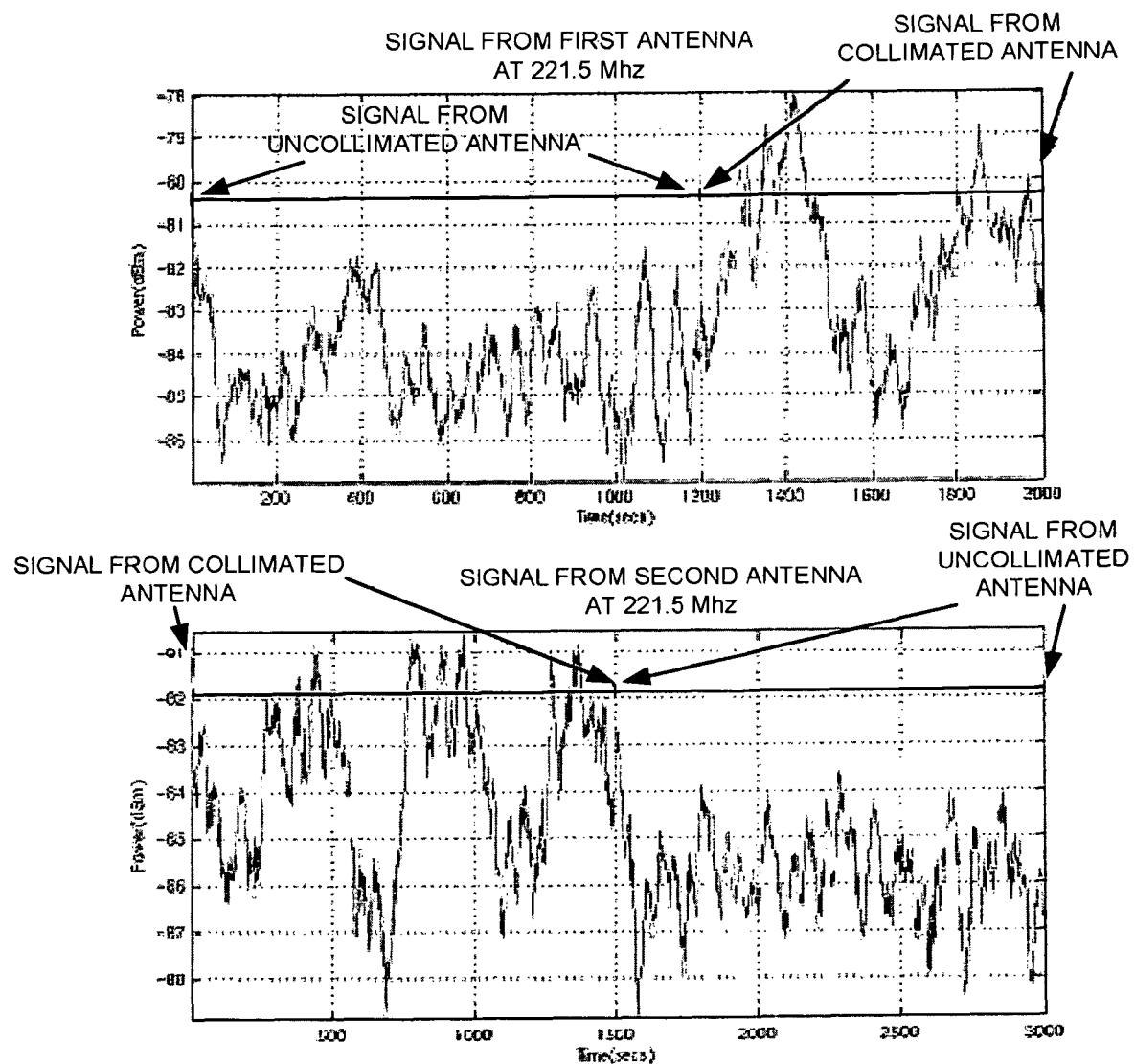
FIG. 7A
FIG. 7B

ANALYZING A TARGET ELECTROMAGNETIC SIGNAL RADIATING FROM A COMPUTER SYSTEM

BACKGROUND

1. Field

This disclosure generally relates to techniques for monitoring computer systems. More specifically, this disclosure relates to a method and an apparatus that characterizes a computer system parameter by analyzing a target electromagnetic signal radiating from the computer system.

2. Related Art

Electromagnetic signals which radiate from computer systems can be used to characterize parameters of the computer system, including parameters that relate to components in the computer system. However, due to the potentially large number of sources of electromagnetic radiation that may be in proximity to the computer system (including electrical equipment, other computer systems, and even other components in the computer system of interest), there may be a substantial background of electromagnetic radiation that can mask the desired signal.

Typically, in order to maximize the desired signal against this background noise, an antenna is placed as close as is practicable to the source of the desired electromagnetic signal, often so that the antenna is inside the computer system of interest. However, for computer systems that do not have built-in antennas, inserting an antenna into an operating computer system can be time-consuming and risky, and powering down the computer system may not be practical or convenient. Furthermore, in some situations, the computer system of interest may not be easily accessible.

Hence, what is needed is a method and an apparatus that characterizes a computer system parameter by analyzing a target electromagnetic signal radiating from the computer system without the above-described problems.

SUMMARY

One embodiment provides a system that characterizes a computer system parameter by analyzing a target electromagnetic signal radiating from the computer system. First, the system monitors the target electromagnetic signal using a first directional antenna located outside of the computer system, wherein the first directional antenna is directed at a location inside the computer system. The system also monitors the target electromagnetic signal using a second directional antenna located outside of the computer system, wherein a receiving axis of the second antenna is oriented non-parallel to a receiving axis of the first antenna, and wherein the second directional antenna is directed at the location inside the computer system. Next, the system characterizes the computer system parameter based on the target electromagnetic signal received from the first antenna and the target electromagnetic signal received from the second antenna. Then, the system generates a request for an action based on the characterization of the computer system.

In some embodiments, characterizing the computer system parameter includes generating a predetermined number of first directional antenna signals based on the target electromagnetic signal monitored using the first directional antenna, and generating a predetermined number of second directional antenna signals based on the target electromagnetic signal monitored using the second directional antenna.

In some embodiments, generating the predetermined number of first directional antenna signals includes dividing the target electromagnetic signal monitored using the first directional antenna into a predetermined number of first directional antenna frequency signals, and generating the predetermined number of second directional antenna signals includes dividing the target electromagnetic signal monitored using the second directional antenna into a predetermined number of second directional antenna frequency signals.

In some embodiments, each first directional antenna frequency signal in the predetermined number of first directional antenna frequency signals is at a different frequency than each other first directional antenna frequency signal in the predetermined number of first directional antenna frequency signals, and each second directional antenna frequency signal in the predetermined number of second directional antenna frequency signals is at a different frequency than each other second directional antenna frequency signal in the predetermined number of second directional antenna frequency signals, wherein each second directional antenna frequency signal is at the same frequency as a first directional antenna frequency signal.

In some embodiments, characterizing the computer system parameter includes using a nonlinear, nonparametric regression model.

In some embodiments, characterizing the computer system includes processing the target electromagnetic signal monitored using the first directional antenna and the target electromagnetic signal monitored using the second directional antenna using a coincidence detection analysis technique.

In some embodiments, the coincidence detection analysis technique uses an independent component analysis technique.

In some embodiments, prior to monitoring the target electromagnetic signal using the first directional antenna and prior to monitoring the target electromagnetic signal using the second directional antenna, the system monitors a reference electromagnetic signal radiating from the computer system, generates a reference electromagnetic-signal fingerprint from the reference electromagnetic signal, and builds a pattern-recognition model based on the reference electromagnetic-signal fingerprint.

In some embodiments, characterizing the computer system parameter includes using a sequential probability ratio test (SPRT).

In some embodiments, the first directional antenna includes a first cantenna and the second directional antenna includes a second cantenna.

In some embodiments, the computer system parameter includes a computer system health metric.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 7A illustrates a directional waveguide antenna for use in accordance with an embodiment.

FIG. 7B illustrates a graph of a target electromagnetic signal at 221.5 Mhz monitored by a first antenna and a second antenna in two configurations: uncollimated and collimated.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media now known or later developed that is capable of storing code and/or data for use by a computer system.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Figure 1:
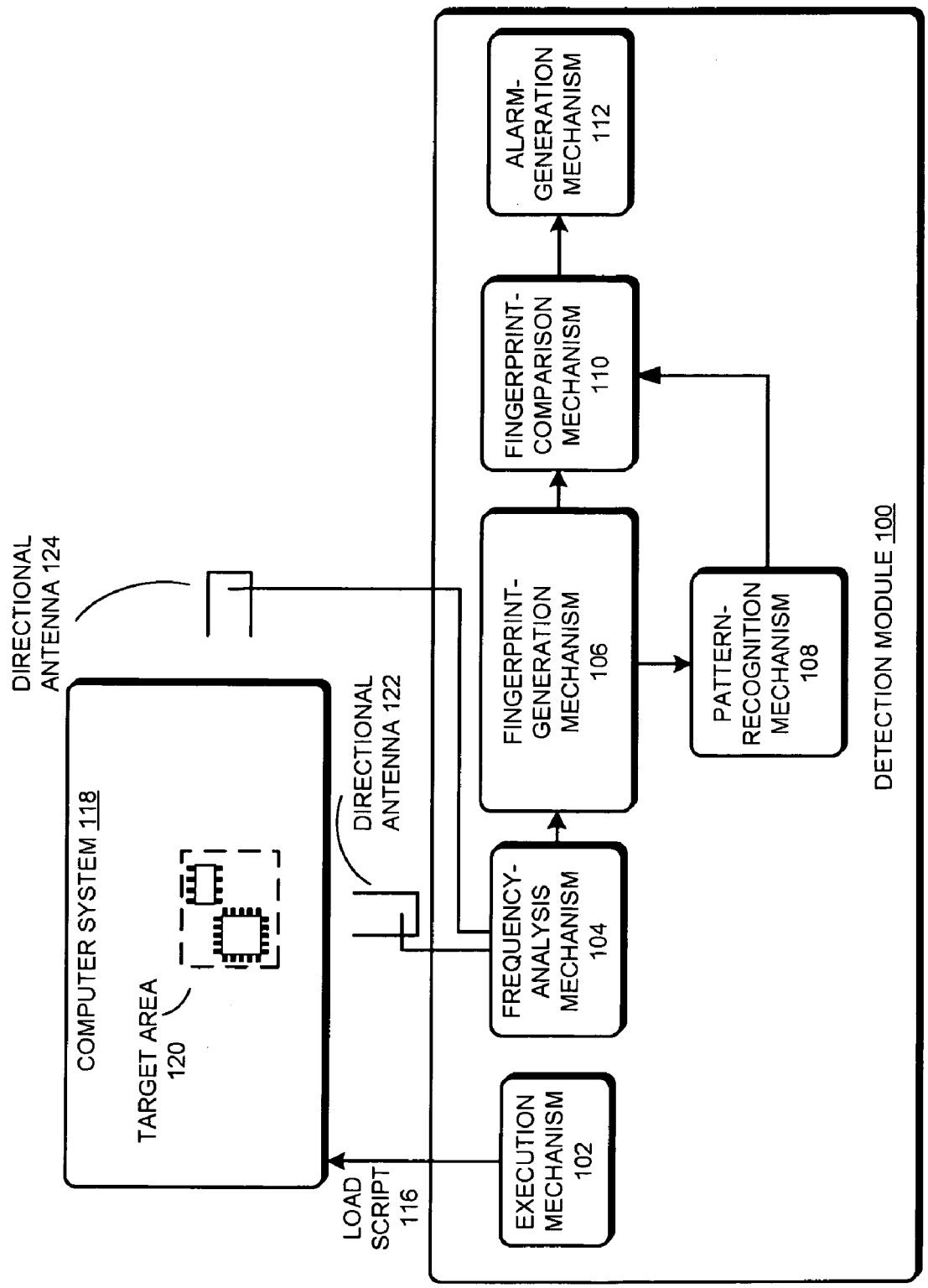
FIG. 1 illustrates a system that characterizes a computer system parameter by analyzing a target electromagnetic signal radiating from the computer system in accordance with an embodiment.

FIG. 1 illustrates a system that characterizes a computer system parameter by analyzing a target electromagnetic signal radiating from the computer system in accordance with an embodiment. As illustrated in FIG. 1, detection module 100 includes: execution mechanism 102, frequency-analysis mechanism 104, fingerprint-generation mechanism 106, pattern-recognition mechanism 108, fingerprint-comparison mechanism 110, and alarm-generation mechanism 112. Computer system 118 includes target area 120.

Execution mechanism 102 causes load script 116 to run on computer system 118. Frequency-analysis mechanism 104 is coupled to directional antenna 122, directional antenna 124, and fingerprint-generation mechanism 106. Fingerprint-generation mechanism 106 is further coupled to pattern-recognition mechanism 108 and fingerprint-comparison mechanism 110. Pattern-recognition mechanism 108 is further coupled to fingerprint-comparison mechanism 110, and fingerprint-comparison mechanism 110 is further coupled to alarm-generation mechanism 112.

Frequency-analysis mechanism 104, fingerprint-generation mechanism 106, pattern-recognition mechanism 108, fingerprint-comparison mechanism 110, and alarm-generation mechanism 112 can each be implemented in any combination of hardware and software. In some embodiments one or more of these mechanisms operates on computer system 118. In some embodiments, one or more of these mechanisms operates on one or more dedicated stand-alone processors, such as a service processor, located inside computer system 118. In some embodiments, one or more of these mechanisms operates on a separate computer system.

Computer system 118 can include but is not limited to a server, a server blade, a datacenter server, an enterprise computer, a field-replaceable unit that includes a processor, or any other computation system that includes one or more processors and one or more cores in each processor.

Target area 120 can be any area of computer system 118 that is radiating electromagnetic signals related to a computer system parameter. In some embodiments, target area 120 includes one or more chips, devices or printed circuit boards that emit electromagnetic signals related to a computer system parameter. In some embodiments, target area 120 includes all of computer system 118. In some embodiments, target area 120 includes multiple target areas in one or more computer systems.

Directional antenna 122 and directional antenna 124 are each coupled to frequency-analysis mechanism 104 and positioned so that the receiving axis of each directional antenna is oriented to receive electromagnetic signals from target area 120. Note that the receiving axis of directional antenna 122 is oriented non-parallel to the receiving axis of directional antenna 124. In some embodiments, the receiving axis of directional antenna 122 and the receiving axis of directional antenna 124 form a 90 degree angle, while in other embodiments, the angle is any included angle from more than 0 degrees to less than 180 degrees.

In some embodiments of the present invention, directional antenna 122, and directional antenna 124 can include but are not limited to one or more of: a Yagi-Uda antenna, a log-periodic antenna, a parabolic antenna, a corner reflector antenna, a phased array antenna, a directional waveguide antenna (such as a cantenna), and any other type of directional antenna now known or later developed.

In some embodiments, directional antenna 122 and directional antenna 124 are placed at fixed orientation with respect to each other and computer system 118 and/or one or more components or areas inside computer system 118. In some embodiments, directional antenna 122 and directional antenna 124 are also each placed at predetermined distances from computer system 118, and/or one or more components or areas inside computer system 118. In some embodiments, directional antenna 122 and directional antenna 124 are physically attached to each other at a predetermined orientation and included angle between their receiving axes.

The electromagnetic signals monitored by directional antenna 122 and directional antenna 124 can be used to characterize any parameter of a computer system including but not limited to any one or more of the following parameters for one or more components in the computer system or the computer system as a whole: model or manufacturer, authenticity, local degradation, the presence and length of metal whiskers, a physical variable, a fault; a prognostic variable, a health metric, or any other parameter that affects an electromagnetic signal radiated from a computer system. The use of electromagnetic signals to characterize parameters of a computer system is discussed in the following: U.S. patent application entitled "Using EMI Signals to Facilitate Proactive Fault Monitoring in Computer Systems," by Kenny C. Gross, Aleksey M. Urmanov, Ramakrishna C. Dhanekula and Steven F. Zwinger, application Ser. No. 11/787,003, filed 12 Apr. 2007, which is hereby fully incorporated by reference; U.S. patent application entitled "Method and Apparatus for Generating an EMI Fingerprint for a Computer System," by Kenny C. Gross, Aleksey M. Urmanov, and Ramakrishna C. Dhanekula, application Ser. No. 11/787,027, filed 12 Apr. 2007, which is hereby fully incorporated by reference; U.S. patent application entitled "Accurately Inferring Physical Variable Values Associated with Operation of a Computer System," by Ramakrishna C. Dhanekula, Kenny C. Gross, and Aleksey M. Urmanov, application Ser. No. 12/001,369, filed 10 Dec. 2007, which is hereby fully incorporated by reference; U.S. patent application entitled "Proactive Detection of Metal Whiskers in Computer Systems," by Ramakrishna C. Dhanekula, Kenny C. Gross, and David K. McElfresh, application Ser. No. 11/985,288, filed 13 Nov. 2007, which is hereby fully incorporated by reference; U.S. patent application entitled "Detecting Counterfeit Electronic Components Using EMI Telemetric Fingerprints," by Kenny C. Gross, Ramakrishna C. Dhanekula, and Andrew J. Lewis, application Ser. No. 11/974,788, filed 16 Oct. 2007, which is hereby fully incorporated by reference; and U.S. patent application entitled "Determining a Total Length for Conductive Whiskers in Computer Systems," by David K. McElfresh, Kenny C. Gross, and Ramakrishna C. Dhanekula, application Ser. No. 12/126,612, filed 23 May 2008, which is hereby fully incorporated by reference.

In some embodiments of the present invention, execution mechanism 102 causes load script 116 to be executed by computer system 118 during a computer-system-parameter-detection process. Note that the computer-system-parameter-detection process can be performed in parallel with normal computer system operation. In some embodiments of the present invention, execution mechanism 102 is only used during the training phase of the computer-system-parameter-detection process. Hence, execution mechanism 102 is idle during the monitoring phase of the computer-system-parameter-detection process. In other embodiments, execution mechanism 102 causes load script 116 to be executed by computer system 118 during the monitoring phase. Then, during the computer-system-parameter-detection process, normal computer system operation is interrupted and execution mechanism 102 causes load script 116 to be executed by computer system 118. In some embodiments of the present invention, load script 116 is stored on computer system 118.

In some embodiments of the present invention, load script 116 can include: a sequence of instructions that produces a load profile that oscillates between specified utilization percentages, and/or a sequence of instructions that produces a customized load profile for a component or device (such as a processor) in computer system 118. In some embodiments of the present invention, load script 116 is a dynamic load script which changes the load on the component or device as a function of time.

In some embodiments of the present invention, during the computer-system-parameter-detection process, the electromagnetic signal generated within one or more circuits in target area 120 is monitored by directional antenna 122 and directional antenna 124. It is noted that the electromagnetic signal can be comprised of a set of one or more electromagnetic signals.

The target electromagnetic signal from each antenna is received by frequency-analysis mechanism 104, which then transforms each of the received electromagnetic signal time-series to the frequency-domain. In some embodiments, one or more of the received target electromagnetic signals are amplified prior to being transformed into the frequency domain. In some embodiments of the present invention, frequency-analysis mechanism 104 can include a spectrum analyzer.

Frequency-analysis mechanism 104 is coupled to fingerprint-generation mechanism 106. In some embodiments fingerprint-generation mechanism 106 generates an electromagnetic-signal fingerprint using a coincidence analysis technique. In some embodiments, the coincidence analysis technique uses an independent component analysis technique applied to the signals monitored by directional antenna 122 and the directional antenna 124. This process is described in more detail below.

As illustrated in FIG. 1, the output of fingerprint-generation mechanism 106 is coupled to the inputs of both pattern-recognition mechanism 108 and fingerprint-comparison mechanism 110. In some embodiments of the present invention, pattern-recognition mechanism 108 performs at least two functions. First, pattern-recognition mechanism 108 is used to build a pattern-recognition model for the electromagnetic signal received from target area 120 by directional antenna 122 and directional antenna 124. This function of pattern-recognition mechanism 108 is described in more detail below. Second, pattern-recognition mechanism 108 can use the pattern-recognition model to compute estimates of the electromagnetic signal fingerprint associated with the electromagnetic-signal received from target area 120 by directional antenna 122 and directional antenna 124. This operation of pattern-recognition mechanism 108 is described in more detail below in conjunction with FIGS. 4 and 5.

Fingerprint-comparison mechanism 110 compares the electromagnetic-signal fingerprint generated by fingerprint-generation mechanism 106 to an estimated electromagnetic-signal fingerprint computed by the pattern-recognition model. The comparison operation performed by fingerprint-comparison mechanism 110 is described in more detail below in conjunction with FIG. 5. Alarm-generation mechanism 112 is configured to generate an alarm based on the comparison results from fingerprint-comparison mechanism 110. In some embodiments, information related to the generated alarms is used to characterize information related to the parameter of computer system 118. The information related to the parameter of the computer system can include but is not limited to any of the parameters discussed in the U.S. patent applications referenced above.

In some embodiments, detection module 100 also includes a performance-parameter-monitoring mechanism that monitors performance parameters of computer system 118. In some embodiments, the performance-parameter-monitoring mechanism includes an apparatus for monitoring and recording computer system performance parameters as set forth in U.S. Pat. No. 7,020,802, entitled "Method and Apparatus for Monitoring and Recording Computer System Performance Parameters," by Kenny C. Gross and Larry G. Votta, Jr., issued on 28 Mar. 2006, which is hereby fully incorporated by reference. The performance-parameter-monitoring mechanism monitors the performance parameters of computer system 118 and sends information related to the monitored performance parameters to frequency-analysis mechanism 104. In these embodiments, information related to the monitored performance parameters is built into the pattern-recognition models, the generated fingerprints and the estimated fingerprints resulting from the electromagnetic signal monitored by directional antenna 122 and directional antenna 124.

In some embodiments of the present invention, prior to characterizing the parameter of computer system 118, detection module 100 is used to build a pattern-recognition model based on fingerprints generated during a training phase when the parameter of computer system 118 is in a known state. For example, if the parameter being characterized is the authenticity of components in computer system 118, then the pattern-recognition model is built when the components in computer system 118 have been verified to be authentic.

Figure 2:
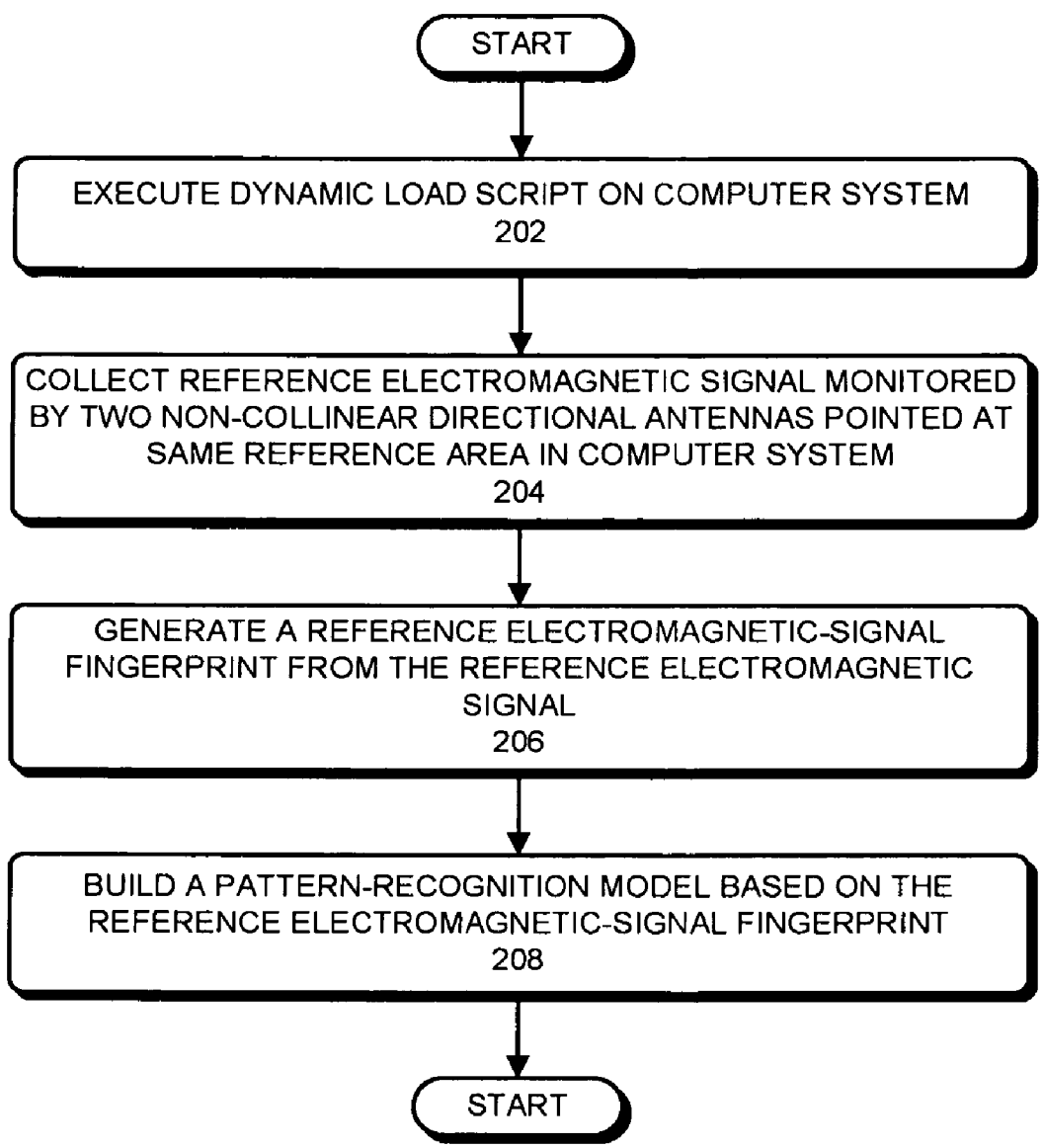
FIG. 2 presents a flowchart illustrating the process of building a pattern recognition model in accordance with an embodiment.

FIG. 2 presents a flowchart illustrating the process of building a pattern-recognition model during a training phase in accordance with an embodiment. During operation, the detection module executes a load script on computer system, wherein the load script includes a specified sequence of operations (step 202). In some embodiments of the present invention, the load script is a dynamic load script which changes the load on a processor in the computer system as a function of time. While executing the load script, the detection module monitors a reference electromagnetic signal time-series using two non-collinear directional antennas pointed at the same reference area within the computer system (step 204). In some embodiments of the present invention, the reference area is the target area when the target area is in a known state. For example, the reference electromagnetic signal can be collected when the computer system is first deployed in the field and the parameter of the computer system is in a known state. In another embodiment, the reference electromagnetic signal can be collected from the reference area after the reference area has been analyzed and the parameter of the computer system is determined to be in a predetermined state.

Next, the system generates a reference electromagnetic-signal fingerprint from the reference electromagnetic signal (step 206). We describe the process of generating the reference electromagnetic-signal fingerprint below in conjunction with FIG. 3. The system next builds the pattern-recognition model based on the reference electromagnetic-signal fingerprint (step 208). Note that step 208 can be performed by pattern-recognition mechanism 108 in FIG. 1. We describe step 208 further below after we provide more details of generating the reference electromagnetic-signal fingerprint.

Figure 3:
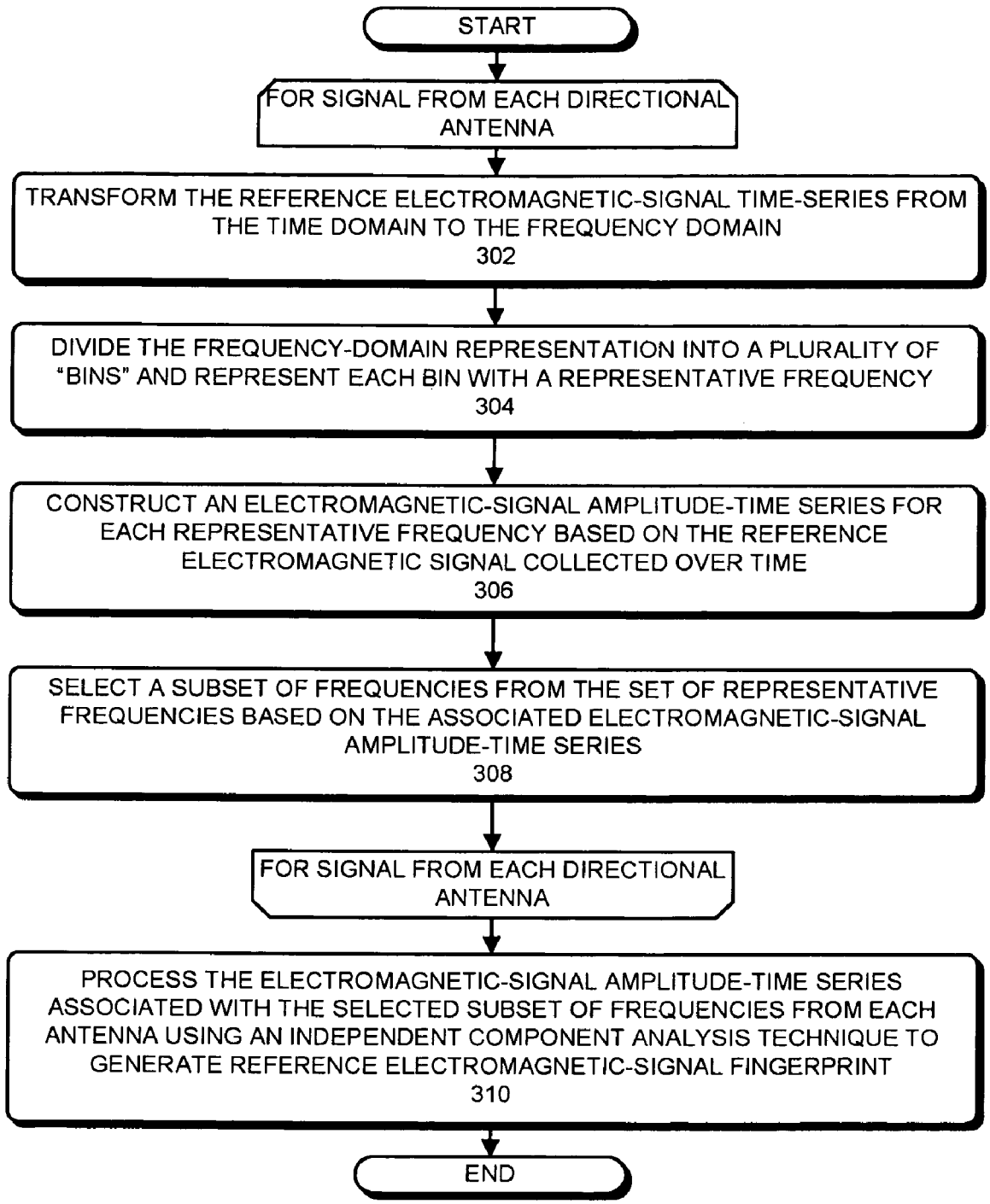
FIG. 3 presents a flowchart illustrating the process of generating the reference electromagnetic-signal fingerprint from the reference electromagnetic signal in accordance with an embodiment.

FIG. 3 presents a flowchart illustrating the process of generating the reference electromagnetic-signal fingerprint from the reference electromagnetic signal in accordance with some embodiments of the present invention. During operation, for the reference signal monitored by each directional antenna, the system starts by transforming the electromagnetic-signal time-series from the time domain to the frequency domain (step 302). In some embodiments of the present invention, transforming the electromagnetic-signal time-series from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

The system then divides the frequency range associated with the frequency-domain representation of the reference electromagnetic signal into a plurality of "bins," and represents each discrete bin with a representative frequency (step 304). For example, one can divide the frequency range into about 600 bins. In some embodiments, these frequency bins and the associated frequencies are equally spaced.

Next, for each of the plurality of representative frequencies, the system constructs an electromagnetic-signal amplitude-time series based on the reference electromagnetic-signal time-series collected over a predetermined time period (step 306). In some embodiments, to generate the time series for each frequency, the electromagnetic signal is sampled at predetermined time intervals, for example once every second or every minute. Next, each of the sampled electromagnetic signal intervals is transformed into the frequency domain, and an electromagnetic-signal amplitude-time pair is subsequently extracted for each of the representative frequencies at each time interval. In this way, the system generates a large number of separate electromagnetic-signal amplitude-time series for the plurality of frequencies.

The system next selects a subset of frequencies from the plurality of frequencies based on the associated electromagnetic-signal amplitude-time series (step 308). It is noted that in some embodiments, a subset of frequencies is not selected and the system uses all of the available frequencies. In some embodiments, selecting the subset of frequencies optimizes detection sensitivity while minimizing computation costs.

Figure 4:
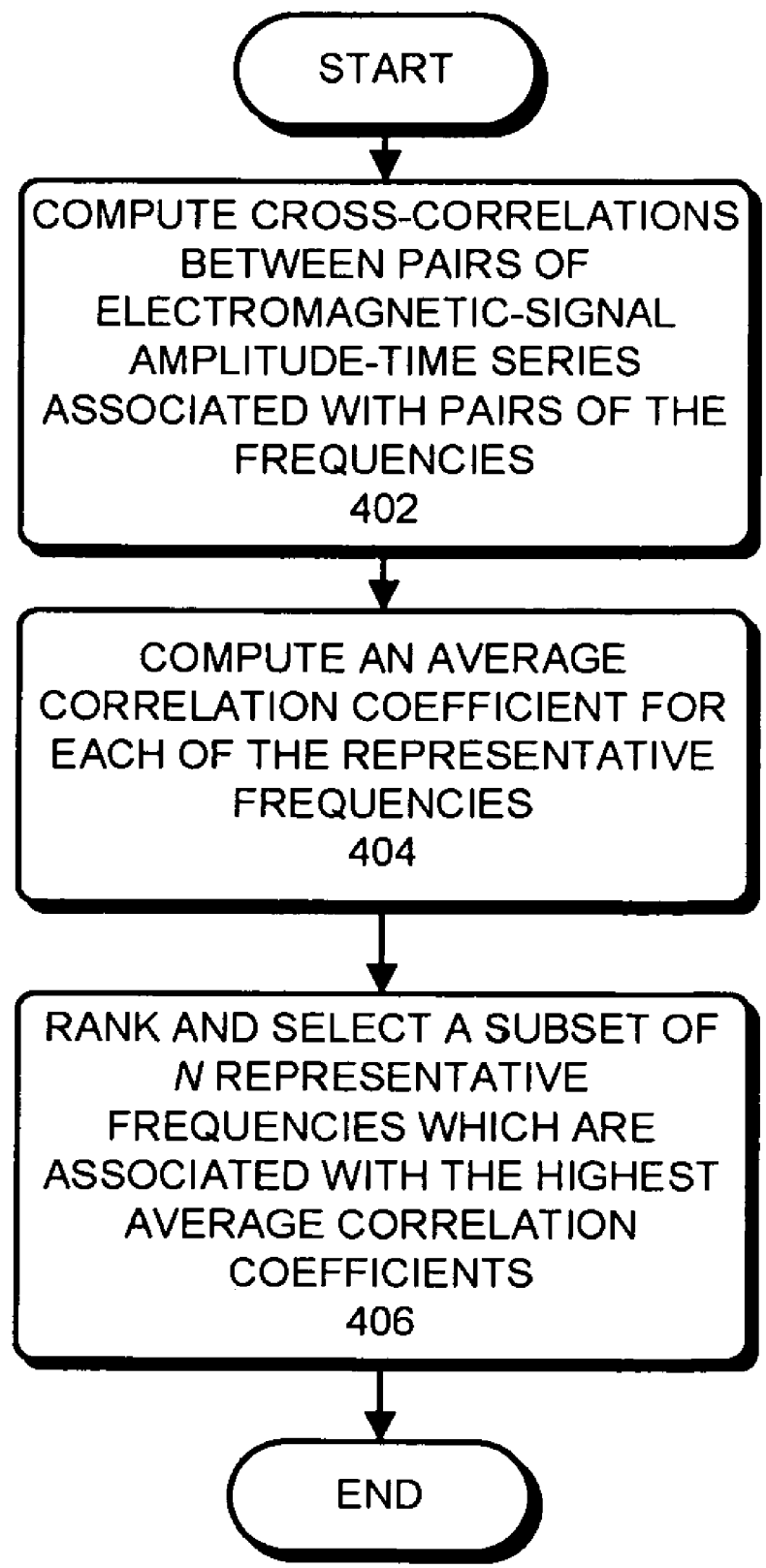
FIG. 4 presents a flowchart illustrating the process of selecting the subset of frequencies based on the correlations between the set of electromagnetic-signal amplitude-time series in accordance with an embodiment.

FIG. 4 presents a flowchart illustrating the process of selecting the subset of frequencies based on the correlations between the set of electromagnetic-signal amplitude-time series in accordance an embodiment. During operation, the system computes cross-correlations between pairs of electromagnetic-signal amplitude-time series associated with pairs of the representative frequencies (step 402). Next, the system computes an average correlation coefficient for each of the plurality of representative frequencies (step 404). The system then ranks and selects a subset of N representative frequencies which are associated with the highest average correlation coefficients (step 406). Note that the electromagnetic-signal amplitude-time series associated with these N frequencies are the most highly correlated with other amplitude-time series. In some embodiments of the present invention, N is typically less than or equal to 20, and maybe 10.

Referring back to FIG. 3, when the subset of frequencies has been selected, the system processes the electromagnetic-signal amplitude-time series associated with the selected frequencies from both antennas using an independent component analysis technique to generate an electromagnetic-signal amplitude-time series that is used to generate a reference electromagnetic-signal fingerprint (step 310). Note that the independent component analysis technique used in some embodiments is described in Oja, E. and Karhunen, J., Signal Separation by Nonlinear Hebbian Learning, *Computational Intelligence—a Dynamic System Perspective*, pp. 83-97, IEEE Press (1995), which is hereby fully incorporated by reference.

Referring back to step 208 in FIG. 2, note that when the reference electromagnetic-signal fingerprint is generated, the system uses the set of N electromagnetic-signal amplitude-time series associated with the selected frequencies resulting from the independent component analysis of the N electromagnetic-signal amplitude-time series from each of the two antennas as training data to train the pattern-recognition model. In some embodiments of the present invention, the pattern-recognition model is a nonlinear, nonparametric (NLNP) regression model. In some embodiments, the NLNP regression technique includes a multivariate state estimation technique (MSET).

The term "MSET" as used in this specification refers to a class of pattern-recognition algorithms. For example, see [Gribok] "Use of Kernel Based Techniques for Sensor Validation in Nuclear Power Plants," by Andrei V. Gribok, J. Wesley Hines, and Robert E. Uhrig, *The Third American Nuclear Society International Topical Meeting on Nuclear Plant Instrumentation and Control and Human-Machine Interface Technologies*, Washington D.C., Nov. 13-17, 2000. This paper outlines several different pattern-recognition approaches. Hence, the term "MSET" as used in this specification can refer to (among other things) any technique outlined in [Gribok], including ordinary least squares (OLS), support vector machines (SVM), artificial neural networks (ANNs), MSET, or regularized MSET (RMSET).

During this model-training process, an NLNP regression model receives the set of electromagnetic-signal amplitude-time series (i.e., the reference electromagnetic-signal fingerprint) as inputs (i.e., training data), and learns the patterns of interaction between the set of N electromagnetic-signal amplitude-time series. Consequently, when the training is complete, the NLNP regression model is configured and ready to perform model estimates for the same set of N electromagnetic-signal amplitude-time series.

Figure 5:
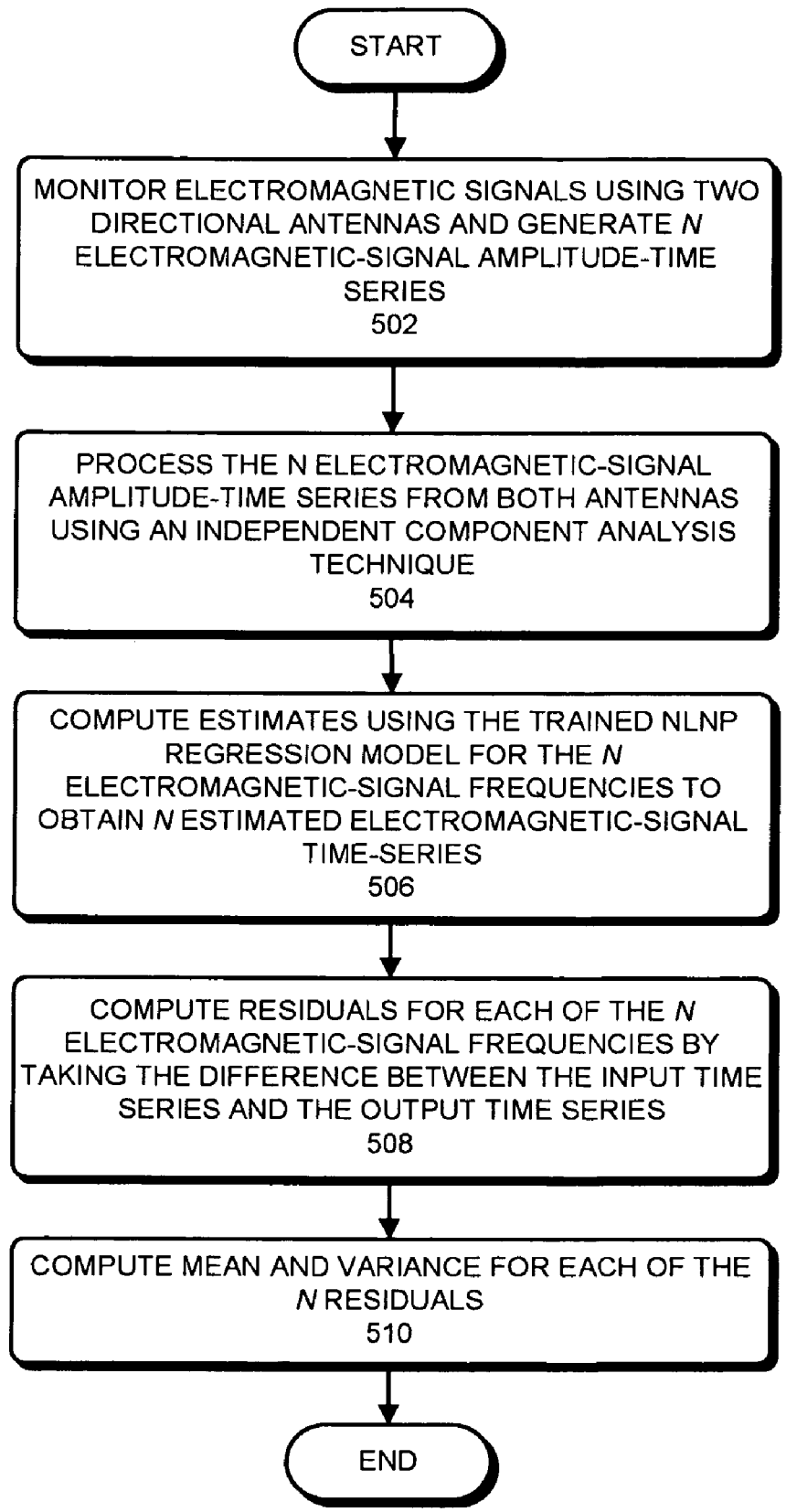
FIG. 5 presents a flowchart illustrating the process of computing the mean and variance of residuals for the model estimates in accordance with an embodiment.

In some embodiments of the present invention, when the NLNP regression model is built, it is subsequently used to compute the mean and variance of residuals associated with the model estimates. Note that these mean and variance values will be used during the monitoring process as described below. Specifically, FIG. 5 presents a flowchart illustrating the process of computing the mean and variance of residuals for the model estimates in accordance with some embodiments of the present invention.

During operation, the system receives an electromagnetic signal from each of the two directional antennas and generates the same set of N electromagnetic-signal amplitude-time series from the electromagnetic signal monitored by each directional antenna in a process as described above (step 502). The system then processes the N electromagnetic-signal amplitude-time series from both antennas using an independent component analysis technique (step 504). Next, the system computes estimates using the trained NLNP regression model for the set of N electromagnetic signal frequencies to obtain N estimated electromagnetic-signal time-series (step 506). Specifically, the NLNP regression model receives the set of N electromagnetic-signal amplitude-time series as inputs and produces a corresponding set of N estimated electromagnetic-signal amplitude-time series as outputs. Next, the system computes the residuals for each of the N electromagnetic signal frequencies by taking the difference between the corresponding input time series and the output time series (step 508). Hence, the system obtains N residuals. The system then computes the mean and variance for each of the N residuals (step 510).

Figure 6A:
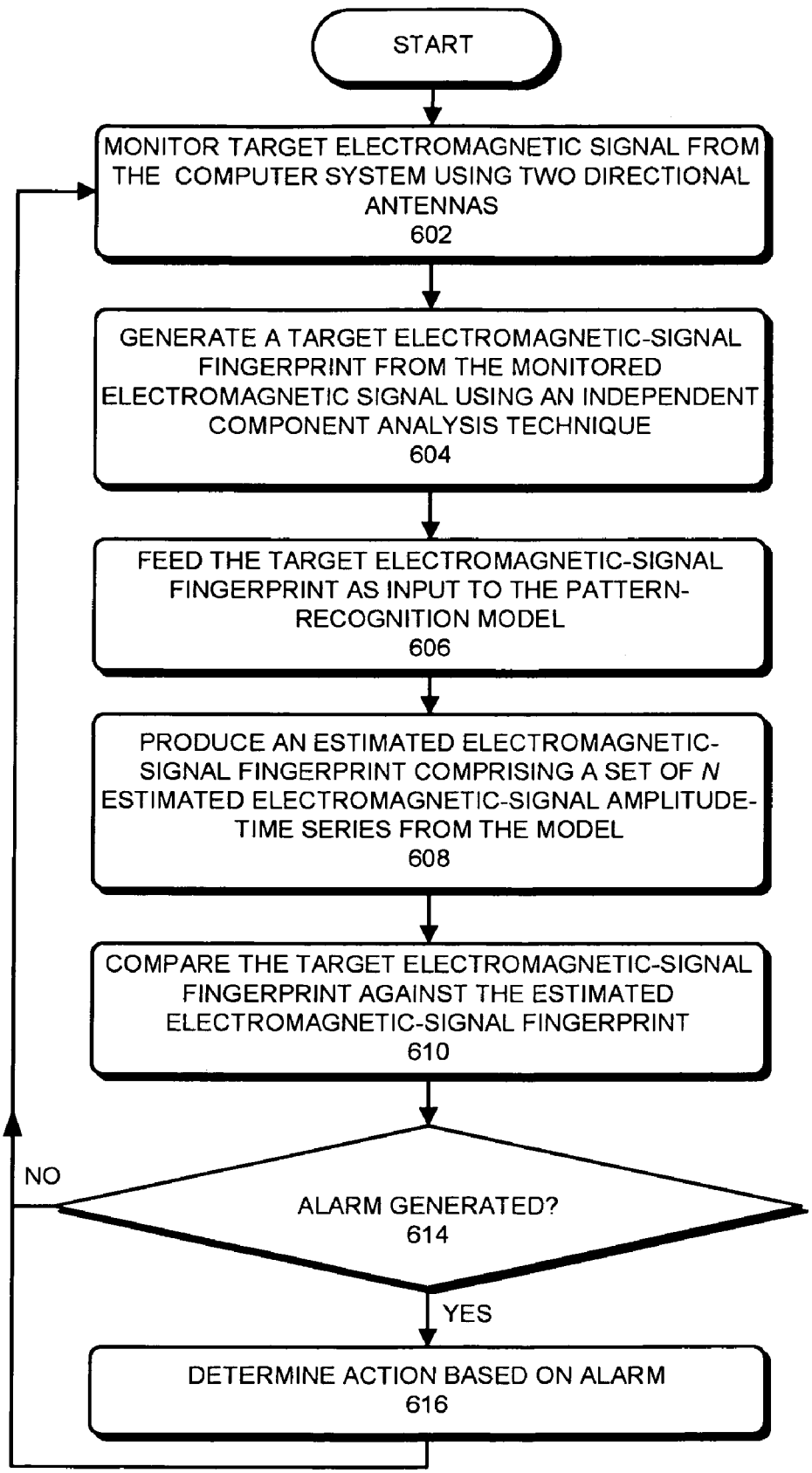
FIGS. 6A and 6B present flowcharts illustrating the process of monitoring an electromagnetic signal to characterize a computer system parameter by analyzing a target electromagnetic signal radiating from the computer system and monitored by two directional antennas in accordance with an embodiment.
Figure 6B:
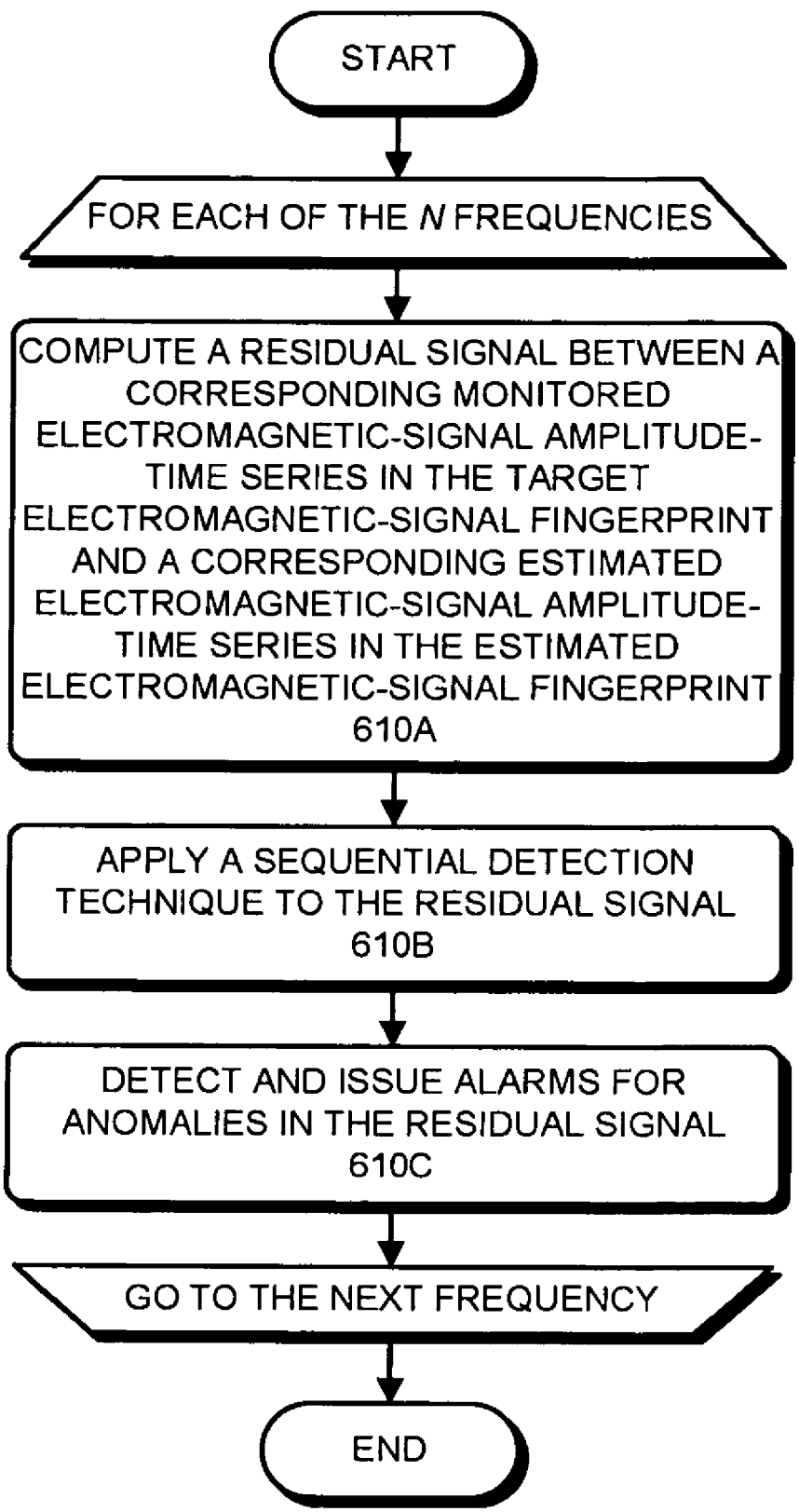

FIGS. 6A and 6B present flowcharts illustrating the process of monitoring an electromagnetic signal to characterize a computer system parameter by analyzing a target electromagnetic signal radiating from the computer system and monitored by two directional antennas in accordance with an embodiment. During a monitoring operation, the system monitors an electromagnetic signal from the target area in the computer system using two nonparallel directional antennas (step 602). In some embodiments of the present invention, the computer system is performing routine operations during the monitoring process; hence, the computer system may be executing any workload during this process. In other embodiments, the computer system executes a load script during the monitoring process.

The system then generates a target electromagnetic-signal fingerprint from the monitored electromagnetic signal using an independent component analysis technique (step 604). Note that the target electromagnetic-signal fingerprint can be generated from the electromagnetic signal in a similar manner to generating the reference electromagnetic-signal fingerprint as described in conjunction with FIG. 3. In some embodiments of the present invention, the system generates the target electromagnetic-signal fingerprint by, for the target electromagnetic signal monitored from each directional antenna: (1) transforming the monitored electromagnetic-signal time-series from the time-domain to the frequency-domain; and (2) for each of the set of N frequencies in the reference electromagnetic-signal fingerprint, generating a monitored electromagnetic-signal amplitude-time series based on the frequency-domain representation of the monitored electromagnetic-signal collected over time, Then, an independent component analysis technique is used to process the monitored electromagnetic-signal amplitude-time series from both of the directional antennas for each of the N frequencies. The resulting monitored electromagnetic-signal amplitude-time series associated with the selected N frequencies is then used to form the target electromagnetic-signal fingerprint. In some embodiments of the present invention, the target electromagnetic-signal fingerprint comprises all the N frequencies as the reference electromagnetic-signal fingerprint. In a further embodiment, the target electromagnetic-signal fingerprint comprises a subset of the N frequencies in the reference electromagnetic-signal fingerprint.

Next, the system feeds the target electromagnetic-signal fingerprint as input to the pattern-recognition model which has been trained using the reference electromagnetic-signal fingerprint (step 606), and subsequently produces an estimated electromagnetic-signal fingerprint as output (step 608). In some embodiments of the present invention, the estimated electromagnetic-signal fingerprint comprises a set of N estimated electromagnetic-signal amplitude-time series corresponding to the set of N monitored electromagnetic-signal amplitude-time series in the target electromagnetic-signal fingerprint.

The system then compares the target electromagnetic-signal fingerprint against the estimated electromagnetic-signal fingerprint (step 610). This step is shown in more detail in FIG. 6B. Specifically, for each of the selected N frequencies, the system computes a residual signal between a corresponding monitored electromagnetic-signal amplitude-time series in the target electromagnetic-signal fingerprint and a corresponding estimated electromagnetic-signal amplitude-time series in the estimated electromagnetic-signal fingerprint (step 610A). The system then applies a sequential detection technique to the residual signal (step 610B). In some embodiments of the present invention, the sequential detection technique is a sequential probability ratio test (SPRT). In some embodiments of the present invention, the SPRT uses the mean and variance computed for the corresponding residual signal during the model training process to detect anomalies in the residual signal, wherein the anomalies indicate a deviation of the monitored electromagnetic-signal amplitude-time series from the estimated electromagnetic-signal amplitude-time series. When such anomalies are detected in the residual signal, SPRT alarms are subsequently issued (step 610C). Note that examples of anomalies in the residual signal can include but are not limited to one or more of: a spike, a series of spikes, a drift, or a step change in the residual signal.

Referring back to FIG. 6A, the system next determines if anomalies are detected in at least one of the N monitored electromagnetic-signal amplitude-time series, for example, based on the SPRT alarms (step 614). If an alarm is not generated (step 614), the process returns to step 602. If an alarm is generated (step 614), then it is determined what action should be taken based on the alarm (step 616). In some embodiments, the system generates a request for an action based on the alarm. Requests based on an alarm may be generated for one or more of the following actions: to notify an operator through a message or indicator such as one or more of a sound, light, message, or page; to schedule a service request for the computer system; to record information related to the circumstances of the generated alarm such as the time, date, and/or one or more performance parameters of the computer system; to request that the computer system operate in a different mode based on the alarm, for example, reducing the power output requirements or cycling for a degrading power supply, or requesting that the computer system be powered down; or any other action described in one or more of the patent applications referenced above.

Figure 7C:
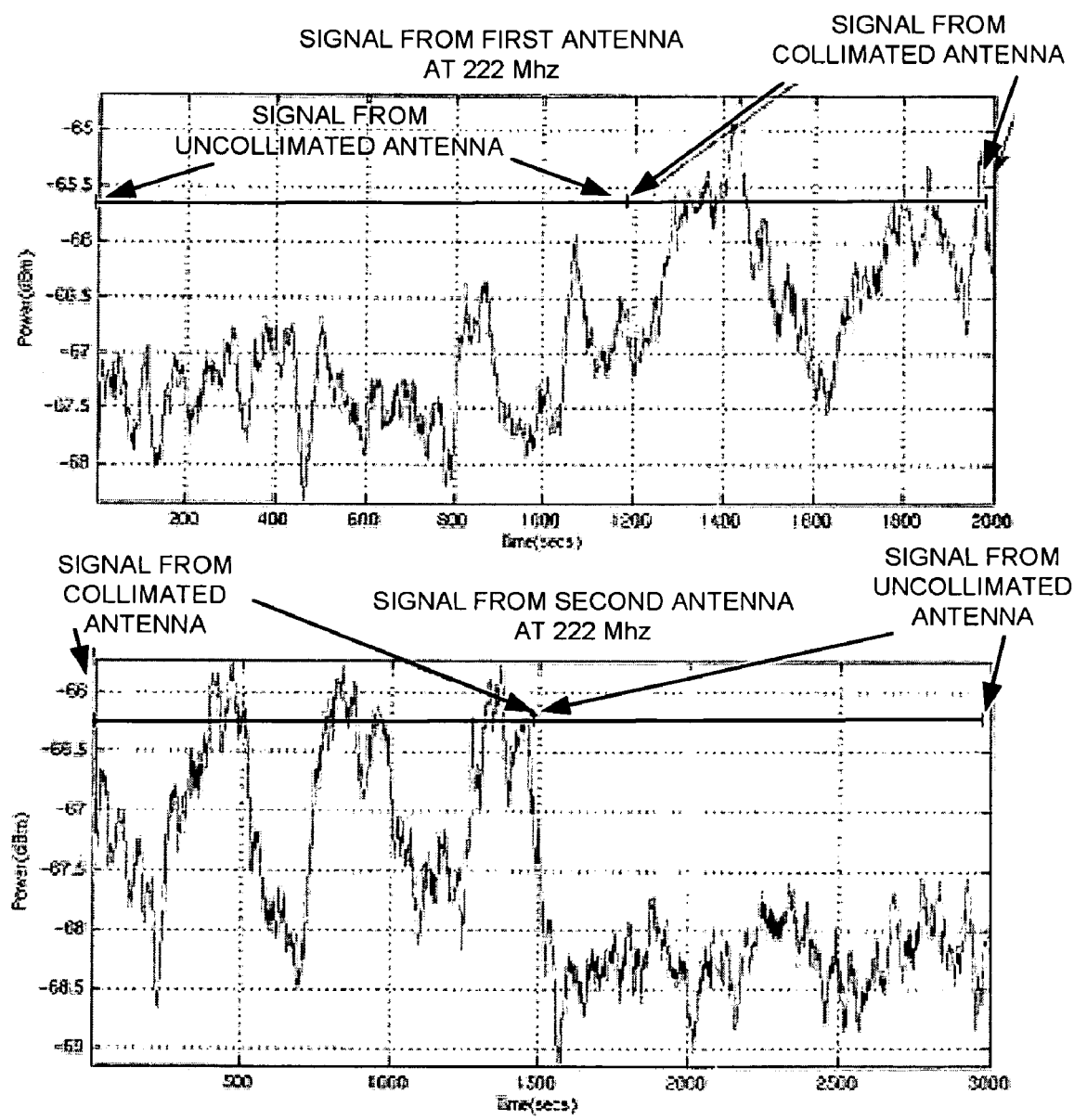
FIG. 7C illustrates a graph of a target electromagnetic signal at 222 Mhz monitored by a first antenna and a second antenna in two configurations: uncollimated and collimated.

FIG. 7A is a picture of a directional waveguide antenna, a cantenna, for use in accordance with an embodiment. Directional antenna 700 is a cantenna with antenna 702 positioned inside collimated waveguide 704. Collimated waveguide 704 is 1.5 inches deep and is similar to cantennas used to receive the electromagnetic signals depicted in FIGS. 7B and 7C.

FIGS. 7B and 7C illustrate graphs of, respectively, a target electromagnetic signal at 221.5 MHz and at 222 MHz, monitored by a first cantenna and a second cantenna in two configurations: uncollimated and collimated. The two cantennas were positioned outside of a computer system so that the receiving axis of each cantenna was pointed at a memory module in the computer system and the included angle between the two receiving axes was 90 degrees. During monitoring, the computer system was running a script that sinusoidally cycled the load on a memory module. Note that when the antenna is in the collimating waveguide and the waveguide is pointed at the memory module, the received signal at both 221.5 MHz and 222 MHz displays periodic peaks which are absent when the collimating wave guide is removed.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for characterizing a computer system parameter by analyzing a target electromagnetic signal radiating from the computer system, the method comprising:
    monitoring the target electromagnetic signal using a first directional antenna located outside of the computer system, wherein the first directional antenna is directed at a location inside the computer system;
    monitoring the target electromagnetic signal using a second directional antenna located outside of the computer system, wherein a receiving axis of the second antenna is oriented non-parallel to a receiving axis of the first antenna, and wherein the second directional antenna is directed at the location inside the computer system;
    characterizing the computer system parameter based on the target electromagnetic signal received from the first antenna and the target electromagnetic signal received from the second antenna, wherein characterizing the computer system parameter comprises:
        generating a predetermined number of first directional antenna signals based on the target electromagnetic signal monitored using the first directional antenna; and
        generating a predetermined number of second directional antenna signals based on the target electromagnetic signal monitored using the second directional antenna; and
        generating a request for an action based on the characterization of the computer system.

2. The method of claim 1 wherein:
    generating the predetermined number of first directional antenna signals includes dividing the target electromagnetic signal monitored using the first directional antenna into a predetermined number of first directional antenna frequency signals; and
    generating the predetermined number of second directional antenna signals includes dividing the target electromagnetic signal monitored using the second directional antenna into a predetermined number of second directional antenna frequency signals.

3. The method of claim 2 wherein:
    each first directional antenna frequency signal in the predetermined number of first directional antenna frequency signals is at a different frequency than each other first directional antenna frequency signal in the predetermined number of first directional antenna frequency signals; and
    each second directional antenna frequency signal in the predetermined number of second directional antenna frequency signals is at a different frequency than each other second directional antenna frequency signal in the predetermined number of second directional antenna frequency signals, wherein each second directional antenna frequency signal is at the same frequency as a first directional antenna frequency signal.

4. The method of claim 2, wherein characterizing the computer system parameter includes using a nonlinear, nonparametric regression model.

5. The method of claim 1 wherein:
    characterizing the computer system parameter includes processing the target electromagnetic signal monitored using the first directional antenna and the target electromagnetic signal monitored using the second directional antenna using a coincidence detection analysis technique.

6. The method of claim 5 wherein the coincidence detection analysis technique uses an independent component analysis technique.

7. The method of claim 1, wherein prior to monitoring the target electromagnetic signal using the first directional antenna and prior to monitoring the target electromagnetic signal using the second directional antenna, the method further comprises:
    monitoring a reference electromagnetic signal radiating from the computer system;
    generating a reference electromagnetic-signal fingerprint from the reference electromagnetic signal; and
    building a pattern-recognition model based on the reference electromagnetic-signal fingerprint.

8. The method of claim 1, wherein characterizing the computer system parameter includes using a sequential probability ratio test (SPRT).

9. The method of claim 1, wherein the first directional antenna includes a first cantenna and the second directional antenna includes a second cantenna.

10. A computer-readable storage medium storing instructions that when executed by a computer cause the computer to perform a method for characterizing a computer system parameter by analyzing a target electromagnetic signal radiating from the computer system, the method comprising:
monitoring the target electromagnetic signal using a first directional antenna located outside of the computer system, wherein the first directional antenna is directed at a location inside the computer system;
monitoring the target electromagnetic signal using a second directional antenna located outside of the computer system, wherein a receiving axis of the second antenna is oriented non-parallel to a receiving axis of the first antenna, and wherein the second directional antenna is directed at the location inside the computer system;
characterizing the computer system parameter based on the target electromagnetic signal received from the first antenna and the target electromagnetic signal received from the second antenna, wherein characterizing the computer system parameter comprises:
generating a predetermined number of first directional antenna signals based on the target electromagnetic signal monitored using the first directional antenna; and
generating a predetermined number of second directional antenna signals based on the target electromagnetic signal monitored using the second directional antenna; and
generating a request for an action based on the characterization of the computer system.

11. The computer-readable storage medium of claim 10 wherein:
generating the predetermined number of first directional antenna signals includes dividing the target electromagnetic signal monitored using the first directional antenna into a predetermined number of first directional antenna frequency signals, wherein each first directional antenna frequency signal in the predetermined number of first directional antenna frequency signals is at a different frequency than each other first directional antenna frequency signal in the predetermined number of first directional antenna frequency signals; and
generating the predetermined number of second directional antenna signals includes dividing the target electromagnetic signal monitored using the second directional antenna into a predetermined number of second directional antenna frequency signals, wherein each second directional antenna frequency signal in the predetermined number of second directional antenna frequency signals is at a different frequency than each other second directional antenna frequency signal in the predetermined number of second directional antenna frequency signals, wherein each second directional antenna frequency signal is at the same frequency as a first directional antenna frequency signal.

12. The computer-readable storage medium of claim 11, wherein characterizing the computer system parameter includes using a nonlinear, nonparametric regression model.

13. The computer-readable storage medium of claim 10 wherein:
characterizing the computer system parameter includes processing the target electromagnetic signal monitored using the first directional antenna and the target electromagnetic signal monitored using the second directional antenna using a coincidence detection analysis technique.

14. The computer-readable storage medium of claim 13 wherein the coincidence detection analysis technique uses an independent component analysis technique.

15. The computer-readable storage medium of claim 10, wherein prior to monitoring the target electromagnetic signal using the first directional antenna and prior to monitoring the target electromagnetic signal using the second directional antenna, the method further comprises:
monitoring a reference electromagnetic signal radiating from the computer system;
generating a reference electromagnetic-signal fingerprint from the reference electromagnetic signal; and
building a pattern-recognition model based on the reference electromagnetic-signal fingerprint.

16. The computer-readable storage medium of claim 10, wherein characterizing the computer system parameter includes using a sequential probability ratio test (SPRT).

17. The computer-readable storage medium of claim 10, wherein the first directional antenna includes a first cantenna and the second directional antenna includes a second cantenna.

18. An apparatus that characterizes a computer system parameter by analyzing a target electromagnetic signal radiating from the computer system, the apparatus comprising:
a first directional antenna located outside of the computer system, wherein the first directional antenna is directed at a location inside the computer system;
a second directional antenna located outside of the computer system, wherein the second directional antenna is directed at a location inside the computer system, wherein a receiving axis of the second antenna is oriented non-parallel to a receiving axis of the first antenna;
a monitoring mechanism configured to monitor the target electromagnetic signal received by the first directional antenna and the target electromagnetic signal received by the second directional antenna; and
a characterizing mechanism configured to characterize the computer system parameter based on the target electromagnetic signal, wherein the characterization mechanism includes a mechanism configured to process the target electromagnetic signal monitored using the first directional antenna and the target electromagnetic signal monitored using the second directional antenna using a coincidence detection analysis technique, and wherein the characterizing mechanism is configured to characterize the computer system parameter by:
generating a predetermined number of first directional antenna signals based on the target electromagnetic signal monitored using the first directional antenna; and
generating a predetermined number of second directional antenna signals based on the target electromagnetic signal monitored using the second directional antenna.

* * * * *